United States Patent
Shima et al.

(10) Patent No.: US 8,410,550 B2
(45) Date of Patent: Apr. 2, 2013

(54) BREAKDOWN VOLTAGE MOS SEMICONDUCTOR DEVICE

(75) Inventors: Masashi Shima, Kawasaki (JP); Kazukiyo Joshin, Kawasaki (JP); Toshihide Suzuki, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 36 days.

(21) Appl. No.: 12/797,078

(22) Filed: Jun. 9, 2010

(65) Prior Publication Data

US 2010/0244965 A1 Sep. 30, 2010

Related U.S. Application Data

(63) Continuation of application No. PCT/JP2008/000010, filed on Jan. 10, 2008.

(51) Int. Cl.
*H01L 29/66* (2006.01)
*H01L 29/78* (2006.01)

(52) U.S. Cl. ............... 257/336; 257/335; 257/E29.256

(58) Field of Classification Search ................... 257/335, 257/336, E29.256
See application file for complete search history.

(56) References Cited

U.S. PATENT DOCUMENTS

| | | | | |
|---|---|---|---|---|
| 5,311,051 A | * | 5/1994 | Tukizi | 257/409 |
| 5,633,521 A | | 5/1997 | Koishikawa | |
| 5,959,332 A | * | 9/1999 | Ravanelli et al. | 257/360 |
| 6,927,453 B2 | * | 8/2005 | Shibib et al. | 257/336 |
| 7,138,689 B2 | | 11/2006 | Inoue et al. | |
| 2004/0108544 A1 | * | 6/2004 | Hossain et al. | 257/328 |
| 2004/0262680 A1 | * | 12/2004 | Ehwald et al. | 257/335 |
| 2005/0067655 A1 | * | 3/2005 | Shibib et al. | 257/344 |
| 2006/0255369 A1 | | 11/2006 | Kim et al. | |
| 2007/0120184 A1 | * | 5/2007 | Cai et al. | 257/335 |
| 2008/0029814 A1 | * | 2/2008 | Khalil | 257/339 |

FOREIGN PATENT DOCUMENTS

| | | | |
|---|---|---|---|
| JP | 5-299649 | A | 11/1993 |
| JP | 05-326945 | A | 12/1993 |
| JP | 07-226505 | A | 8/1995 |
| JP | 8-330580 | A | 12/1996 |
| JP | 09-181300 | A | 7/1997 |
| JP | 10-093079 | A | 4/1998 |
| JP | 2004-207498 | A | 7/2004 |
| JP | 2005-093458 | A | 4/2005 |
| JP | 2005-136169 | A | 5/2005 |
| JP | 2005-236142 | A | 9/2005 |
| JP | 2006-319010 | A | 11/2006 |

(Continued)

OTHER PUBLICATIONS

J. C. Mitros et al, "High-Voltage Drain Extended MOS Transistors for 0.18-um Logic CMOS Process", IEEE Transactions on Electron Devices, Aug. 2001, pp. 1751-1755, vol. 48, No. 8.

(Continued)

*Primary Examiner* — Jerome Jackson, Jr.
*Assistant Examiner* — Paul Budd
(74) *Attorney, Agent, or Firm* — Westerman, Hattori, Daniels & Adrian, LLP (57) ABSTRACT

A semiconductor device has: a low concentration drain region creeping under a gate electrode of a MIS type transistor; a high concentration drain region having an impurity concentration higher than the low concentration drain region and formed in the low concentration drain region spaced apart from the gate electrode; and an opposite conductivity type region of a conductivity type opposite to the drain region formed in the low concentration drain region on a surface area between the high concentration drain region and the gate electrode, the opposite conductivity type region and low concentration drain region forming a pn junction.

9 Claims, 11 Drawing Sheets

FOREIGN PATENT DOCUMENTS

JP        2006-319331 A      11/2006

OTHER PUBLICATIONS

International Search Report of PCT/JP2008/000010, Mailing Date of Apr. 22, 2008.
Chinese Office Action dated Oct. 26, 2011, issued in corresponding Chinese Patent Application No. 200880124601.6.
Chinese Office Action dated Jun. 25, 2012, issued in corresponding Chinese Patent Application No. 200880124601.6.
Japanese Office Action dated Aug. 7, 2012, issued in corresponding Japanese Patent Application No. 2009-548805, with Partial Translation (7 pages).
Chinese Office Action dated Oct. 31, 2012 issued in corresponding Chinese patent application No. 200880124601.6 (with English translation).

* cited by examiner

BREAKDOWN VOLTAGE MOS SEMICONDUCTOR DEVICE

CROSS-REFERENCE TO RELATED APPLICATION

This is a continuation application based upon and claims the benefit of priority of the prior PCT Application No. PCT/JP2008/000010, filed on Jan. 10, 2008, the entire contents of which are incorporated herein by reference.

FIELD

The embodiments discussed herein are related to a semiconductor device and its manufacture method.

BACKGROUND

Investigation into an improved breakdown voltage is now conducted for metal insulator semiconductor (MIS) type transistors such as metal oxide semiconductor (MOS) type transistors.

Figure 15:
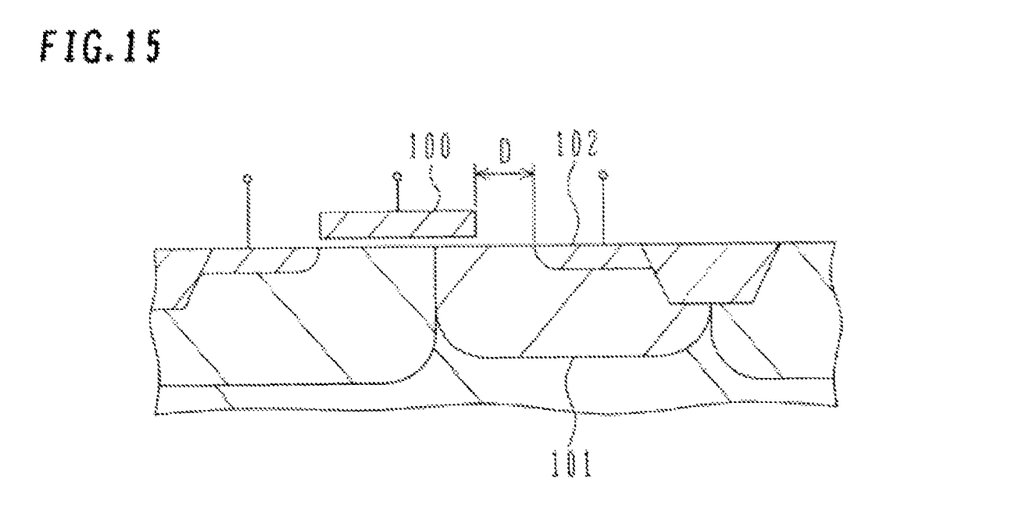
FIG. 15 is a cross sectional view of an n-type MOS transistor described in J. C. Mitros et al. IEEE transactions on electron devices vol. 48 pp 1751-1754 August 2001.

FIG. 15 is a cross sectional view of an n-type MOS transistor disclosed by J. C. Mitros et al. in IEEE transactions on electron devices vol. 48 pp 1751-1754 August 2001 ((a) of FIG. 1 in the transactions).

An n-type high concentration impurity region 102 of a drain is spaced apart from a gate electrode 100 by an offset length D. A low concentration n-well 101 is inclusive of the n-type high concentration impurity region 102, and extends to the region under the gate electrode 100 on the drain side. As a high voltage is applied to the drain, the n-well 101 is depleted in the region between the gate electrode 100 and n-type high concentration impurity region 102 of the drain so that a voltage applied to the substrate just under the gate electrode 100 at the drain side edge is relaxed. A drain breakdown voltage is improved in this manner.

MOS transistors having the similar structure that a high concentration impurity region of a drain is spaced apart from a gate electrode via a low concentration impurity region of the drain are disclosed in other documents, e.g., Japanese Patent Unexamined Publication 2005-093458, Japanese Patent Unexamined Publication 2006-319331, Japanese Patent Unexamined Publication 2005-136169 and Japanese Patent Unexamined Publication 2004-207498.

If a higher breakdown voltage is desired with the above-described structure, an offset length between the high concentration impurity region of the drain and the gate is elongated. However, as the offset length is elongated, a transistor on-resistance increases so that a transistor drive performance is degraded.

SUMMARY

According to one aspect of the present invention, a semiconductor device includes: a semiconductor substrate having a first region of a first conductivity type; a gate insulating film formed on the first region; a gate electrode formed on the gate insulating film; a source region of a second conductivity type opposite to the first conductivity type formed in the first region on one side of the gate electrode; a low concentration drain region of the second conductivity type, formed in the first region on another side of the gate electrode, an end of the drain region on a side of the source region creeping under the gate electrode; a high concentration drain region of the second conductivity type formed in the low concentration drain region and spaced apart from the gate electrode, the high concentration drain region having an impurity concentration higher than the low concentration region; and an opposite conductivity type region of the first conductivity type formed in the low concentration drain region on a surface region between the high concentration drain region and the gate electrode, the opposite conductivity type region and the low concentration drain region forming a pn junction.

According to another aspect of the present invention, a semiconductor device manufacture method includes: preparing a semiconductor substrate having a first region of a first conductivity type; forming a low concentration drain region of a second conductivity type opposite to the first conductivity type in the first region; forming a gate insulating film on the first region and the low concentration drain region; forming a gate electrode of the first gate insulating film, the gate electrode having an overlap with both the first region and the low concentration drain region; forming an opposite conductivity type region of the first conductivity type by implanting impurities for determining the first conductivity type into a surface layer of the low concentration drain region; forming an insulating film above the low concentration drain region, the insulating film covering a side wall of the gate electrode on a side of the low concentration drain region and extending to a partial area above the opposite conductivity type region; forming a high concentration drain region of the second conductivity type having an impurity concentration higher than the low concentration drain region, by using the insulating film as a mask and implanting impurities for determining the second conductivity into the opposite conductivity type region and an underlying region of the low concentration drain region; and forming a source region of the second conductivity type in the first region on a side of the low concentration region opposite to the gate electrode.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Description will now be made on a manufacture method for a metal oxide semiconductor (MOS) transistor according to the first embodiment of the present invention. FIGS. 1A to 3C are schematic cross sectional views illustrating processes of manufacturing a MOS transistor of the first embodiment.

Figure 1A:
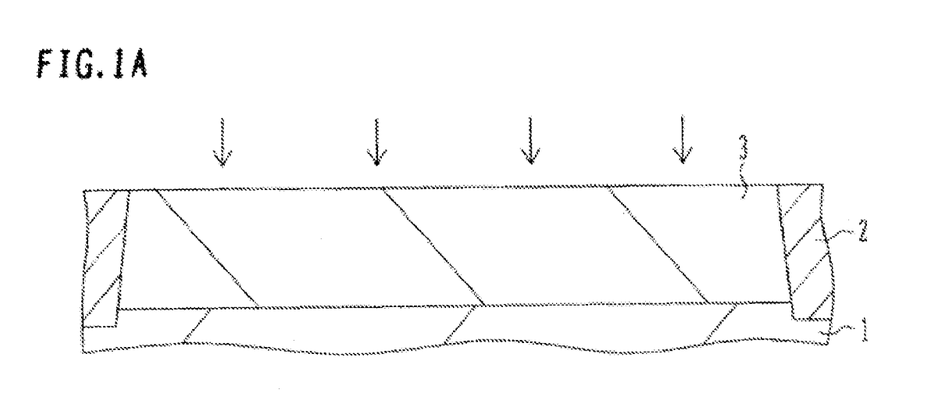
FIGS. 1A and 1B are schematic cross sectional views illustrating processes of manufacturing a MOS transistor of the first embodiment.

First, as illustrated in FIG. 1A, an element isolation region 2 is formed in an n-type silicon substrate 1 to define active regions in which semiconductor elements are to be formed. The element isolation region 2 is able to be formed, for example, by shallow trench isolation (STI).

After the element isolation region 2 is formed, p-type impurities, e.g., boron (B), is implanted into the n-type silicon substrate 1 at an acceleration energy of 200 keV and a dose of $1\times10^{13}$ cm$^{-2}$ (notational convention such as 1E13 is used hereinafter) to form a p-type well 3. Next, B is implanted into the p-type well 3 at an acceleration energy of 20 keV and a dose of 1E12 to adjust a threshold value.

Figure 1B:
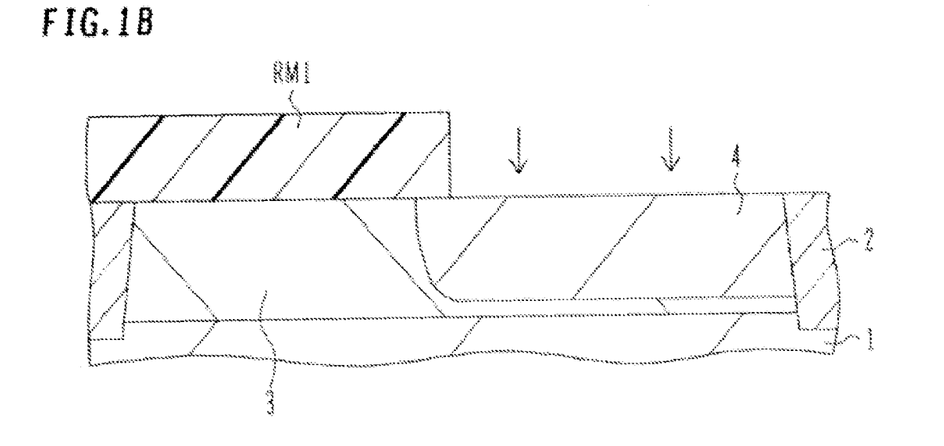

Next, as illustrated in FIG. 1B, a region not requiring ion implantation is covered with a resist mask RM1, and n-type impurities, e.g., phosphorus (P), is implanted into a partial region of the p-type well 3 at an acceleration energy of 200 keV and a dose of 1E13 to form a lightly doped drain (LDD) region 4. After the LDD region 4 is formed, the resist mask RM1 is removed.

Figure 2A:
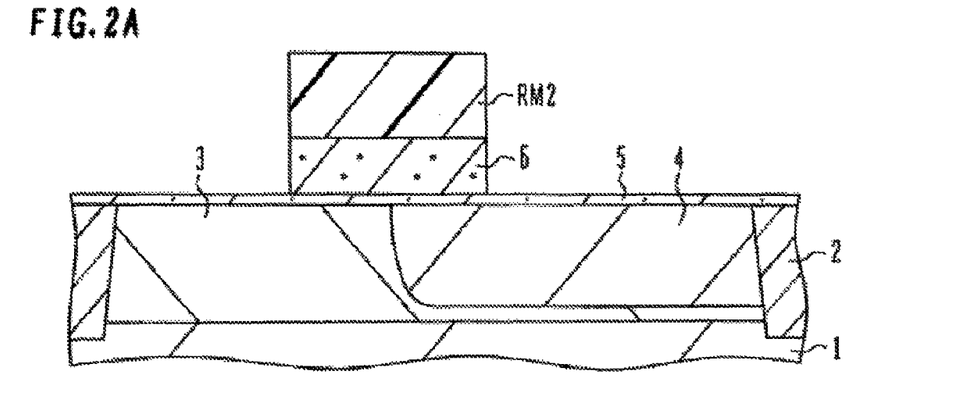
FIGS. 2A to 2C are schematic cross sectional views following FIGS. 1A and 1B and illustrating processes of manufacturing the MOS transistor of the first embodiment.

Next, as illustrated in FIG. 2A, the surfaces of the p-type well 3 and LDD region 4 are thermally oxidized to form a gate insulating film 5 having a thickness of, for example, 5 nm to 10 nm. The material and thickness of the gate insulating film are selected so as to satisfy the breakdown voltage requirements between the gate and drain (and between the source and gate) during DC voltage operation of the MOS transistor. The gate insulating film 5 made of a silicon oxide film and having a thickness of 5 nm to 10 nm is estimated to provide a breakdown voltage of DC 3.3 V.

For example, polysilicon is deposited on the gate insulating film 5 to a thickness of 100 nm by chemical vapor deposition (CVD). A region where the polysilicon film is to be left is covered with a resist mask RM2, and an unnecessary polysilicon layer is removed by dry etching to form a gate electrode 6. The gate electrode 6 is disposed having an overlap with both the p-type well 3 and LDD region 4. After the gate electrode 6 is formed, the resist mask RM2 is removed.

Figure 2B:
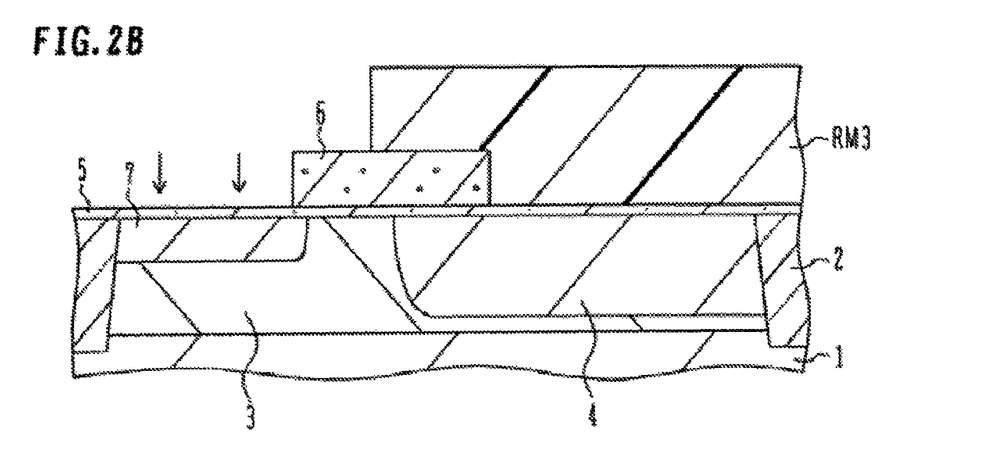

Next, as illustrated in FIG. 2B, the LDD region 4 is covered with a resist mask RM3 and by using the gate electrode 6 as a mask, impurities, e.g., P, is implanted at an acceleration energy of 30 keV and a dose of 1E13 into the p-type well 3 to form a low concentration source region 7. After the low concentration source region is formed, the resist mask RM3 is removed.

Figure 2C:
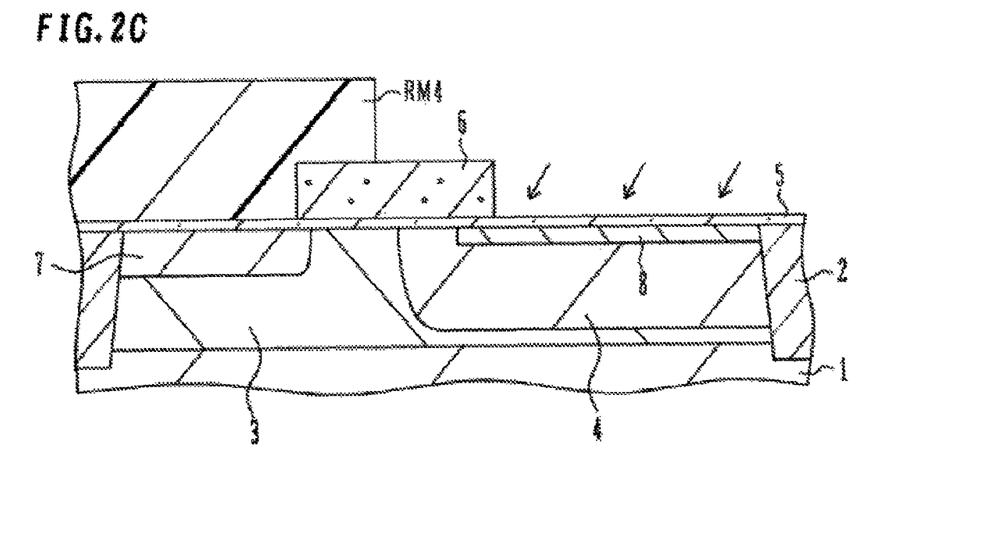

Next, as illustrated in FIG. 2C, by covering the low concentration source region 7 with a resist mask RM4 and using the gate electrode 6 as a mask, impurities, e.g., B, is implanted into the LDD region 4 at an acceleration of 3 keV and a dose of 1E13 to form an opposite conductivity type region 8 by inverting a conductivity type of a surface layer of the LDD region 4 from the n-type to p-type. Ion implantation along an oblique direction is performed in such a manner that an end of the opposite conductivity type region 8 on the side of the gate electrode 6 creeps under the gate electrode 6. After the opposite conductivity type region 8 is formed, the resist mask RM4 is removed.

Figure 3A:
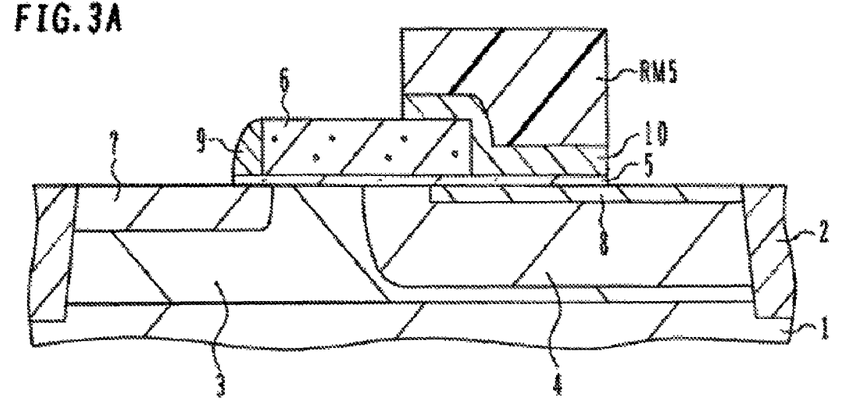
FIGS. 3A to 3C are schematic cross sectional views following FIGS. 2A to 2C and illustrating processes of manufacturing the MOS transistor of the first embodiment.

Next, as illustrated in FIG. 3A, an insulating film, e.g., a silicon oxide film, is deposited on the gate insulating film 5 to a thickness of 50 nm by CVD, the insulating film covering the gate electrode 6.

A resist mask RM5 is formed on the insulating film, covering the end portion of the gate electrode on the drain side and the region of the opposite conductivity type region 8 on the gate electrode side. The silicon oxide film on a flat upper surface not covered with the resist mask RM5 is removed by reactive ion etching (RIE).

Etching is terminated by leaving a side wall spacer 9 on the side wall of the gate electrode 6 on the source side. As the resist mask RM5 is removed, a silicide block insulating film 10 is left covering a region near the end of the gate electrode 6 on the drain side (covering at least a side wall of the gate electrode 6 on the drain side) and extending to the partial area above the opposite conductivity type region 8. This etching patterns also the gate insulating film 5 so as to be conformal to the side wall spacer 9 and silicide block insulating film 10.

Figure 3B:
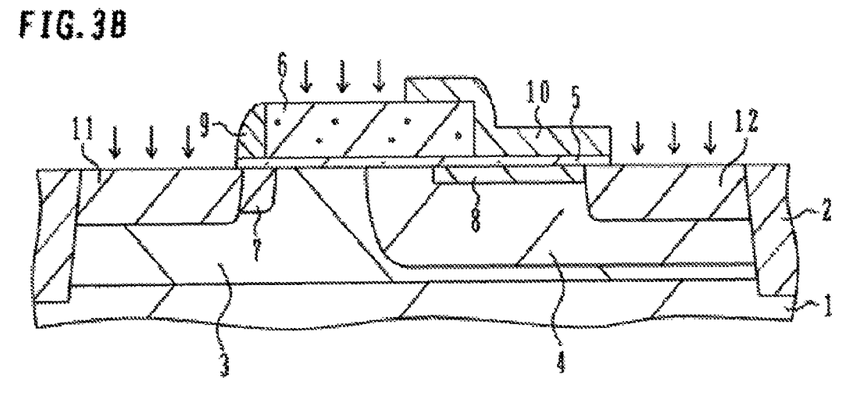

Next, as illustrated in FIG. 3B, by using the side wall spacer 9 and silicide block insulating film 10 as a mask, n-type impurities, e.g., arsenic (As) is implanted at an acceleration energy of 30 keV and a dose of 1E15 to form a high concentration source region 11 and a highly doped drain (HDD) region 12. In this case, n-type impurities are also implanted into an upper region of the gate electrode 6 not covered with the silicide block insulating film 10 and exposed.

The HDD region 12 is formed by implanting n-type impurities into the opposite conductivity type region 8 and the underlying LDD region 4. The conductivity type of the ion-implanted opposite conductivity type region 8 is inverted from the p-type to take again the n-type.

Figure 3C:
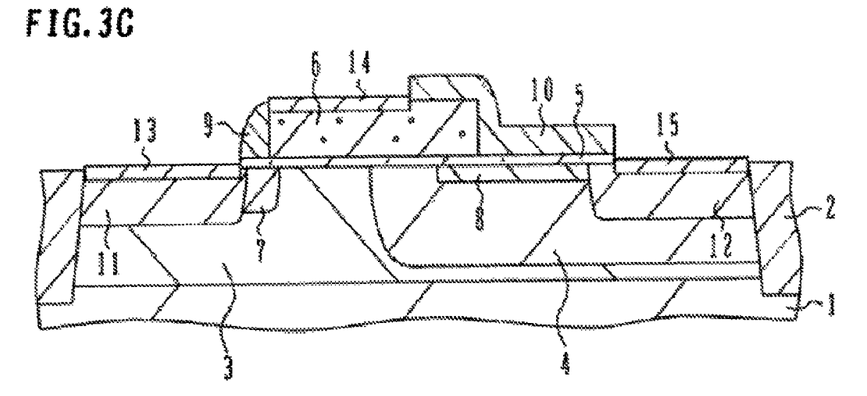

Next, as illustrated in FIG. 3C, cobalt (Co) is deposited by sputtering, and heat treatment is performed to form a source side silicide region 13, a gate electrode silicide region 14 and a drain side silicide region 15 in a surface layer of the highly doped source region 11, in an upper portion of the gate electrode, and in a surface layer of the HDD region 12, respectively. The MOS transistor of the first embodiment is formed in the manner described above.

Figure 4:
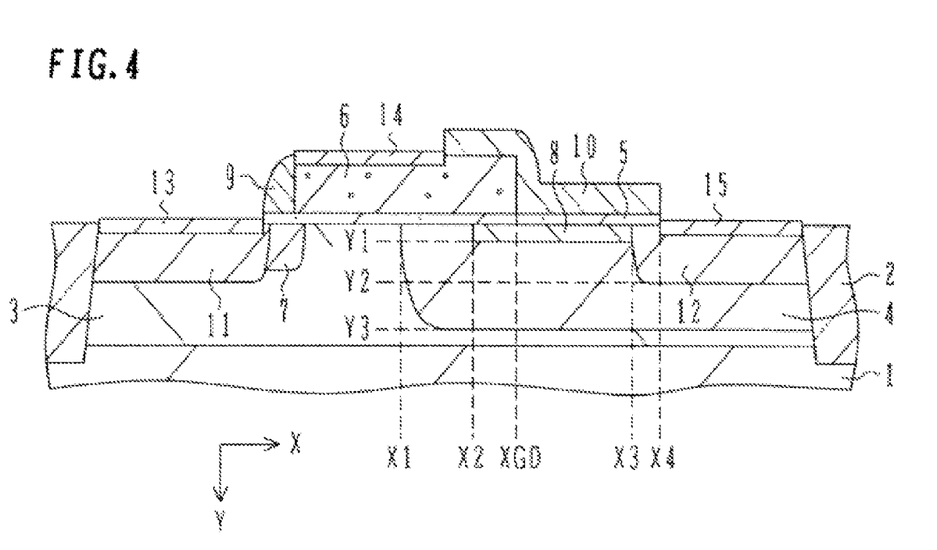
FIG. 4 is a schematic cross sectional view of the MOS transistor of the first embodiment.

With reference to FIG. 4, description will further be made on the drain side structure of the MOS transistor of the first embodiment.

A direction from the edge of the gate electrode 6 on the source side toward the drain side is defined as an X direction. The source side is called the left, and the drain side is called the right. The X direction is also called a horizontal direction. The left end of the LDD region 4 is represented by X1, the left end of the opposite conductivity type region 8 is represented by X2, the right end of the opposite conductivity type region 8 is represented by X3, the left end of the drain side silicide region 15 is represented by X4, and the right end of the gate electrode 6 is represented by XGD. First, description will be made on a positional relation among respective regions along the horizontal direction.

At the left end X1 of the LDD region 4, the p-type well 3 and LDD region 4 form a pn junction. The opposite conductivity type region 8 and HDD region 12 are formed in the LDD region 4. The left end X2 of the opposite conductivity type region 8 is disposed spaced apart from the left end X1 of the LDD region 4 toward the HDD region 12 (X1<X2). At the left end X2 of the opposite conductivity type region 8, the LDD region 4 and opposite conductivity type region 8 form an np junction. At the right end X3 of the opposite conductivity type region 8, the opposite conductivity type region 8 and HDD region 12 form a pn junction.

The gate electrode 6 is formed overlapping both the p-type well 3 and LDD region 4. Namely, the LDD region 4 is formed creeping under the gate electrode 6, and the left end X1 of the LDD region 4 is nearer to the source side than the right end XGD of the gate electrode 6 (X1<XGD). The opposite conductivity type region 8 is formed also creeping under the gate electrode 6, and the left end X2 of the opposite conductivity type region 8 is nearer to the source side than the right end XGD of the gate electrode 6 (X2<XGD).

The opposite conductivity type region 8 exists between the gate electrode 6 and HDD region 12, and the right end XGD of the gate electrode 6 and the left end of the HDD region 12 (right end of the opposite conductivity type region 8) are spaced apart from each other (XGD<X3).

The HDD region 12 under the silicide block insulating film 10 exists between the opposite conductivity type region 8 and drain side silicide region 15, and the right end X3 of the opposite conductivity type region 8 and the left end X4 of the drain side silicide region 15 are spaced apart from each other (X3<X4).

A normal direction from the surface of the substrate 1 toward the lower side is defined as a Y direction. The Y direction is also called a vertical direction. The bottom end of the opposite conductivity type region 8 is represented by Y1, the bottom end of the HDD region 12 is represented by Y2, and the bottom end of the LDD region 4 is represented by Y3. Next, description will be made on the positional relation among respective regions in the vertical direction.

At the bottom end Y3 of the LDD region 4, the p-type well 3 and LDD region 4 form a pn junction. The opposite conductivity type region 8 and HDD region 12 are formed in the LDD region 4, and the bottom end Y1 of the opposite conductivity type region 8 and the bottom end Y2 of the HDD region 12 are disposed above the bottom end Y3 of the LDD region 4 (Y1, Y2<Y3). The opposite conductivity type region 8 is formed on the surface of the LDD region 4, and the bottom end Y1 of the opposite conductivity type region 8 is positioned shallower than the bottom end Y2 of the HDD region 12 (Y1<Y2). At the bottom end Y1 of the opposite conductivity type region 8, the LDD region 4 and opposite conductivity type region 8 form an np junction.

Next, description will be made on the relation among concentrations NL, NP and NH of conductivity type determining impurities in the LDD region 4, opposite conductivity type region 8 and HDD region 12, respectively. The impurity concentrations in these regions satisfy the relation of NL<NP<NH.

Next, with reference to FIGS. 5 and 6, description will be made on a breakdown voltage performance of the MOS transistor of the first embodiment.

Figure 5:
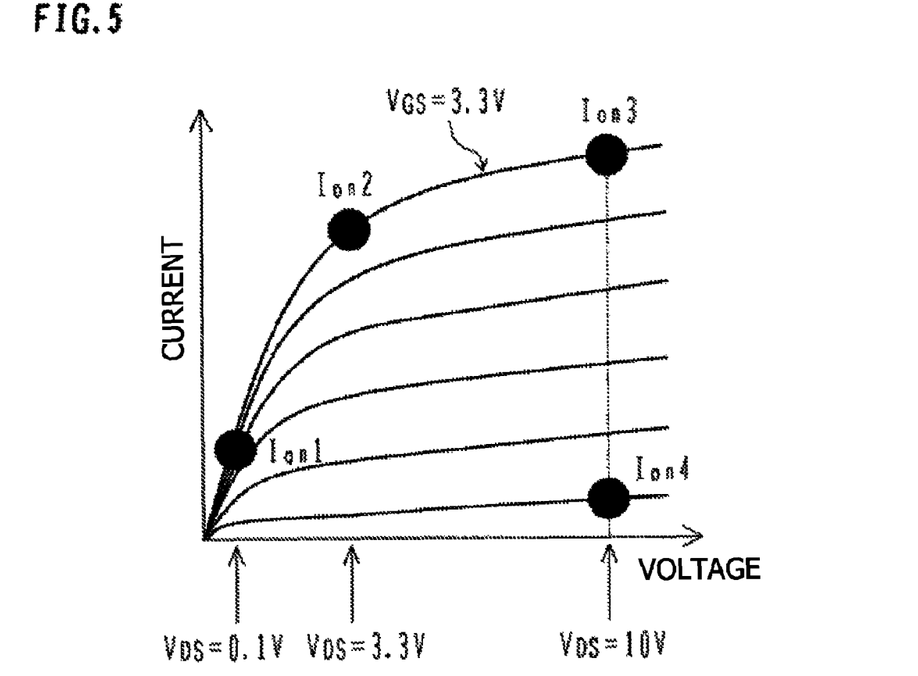
FIG. 5 is a graph illustrating current-voltage (IV) characteristics of a MOS transistor.

FIG. 5 is a graph illustrating the current-voltage (IV) characteristics of a MOS transistor. The abscissa represents a drain voltage ($V_{DS}$), and the ordinate represents a channel current. A plurality of IV curves are illustrated by changing the gate voltage ($V_{GS}$) from near 0 V to 3.3 V. As the gate voltage is raised, a current value at a predetermined gate voltage increases and the IV curve is raised.

Several operating points Ion are illustrated in the graph. The operating point Ion4 is obtained in the state that the gate voltage is near 0 V (e.g., 0.3 V) and the drain voltage is as high as 10 V, namely in the state that a potential difference between the gate and drain is as very high as about 10 V. The operation at the operating point Ion4 becomes an index indicating a breakdown voltage.

The operating point Ion1 is obtained in the state that the gate voltage is 3.3 V and the drain voltage is as low as 0.1 V. The operation at the operating point Ion1 becomes an index indicating an on-resistance (Ron). The operating point Ion2 is obtained in the state that the gate voltage is 3.3V and the drain voltage is 3.3 V. The operating point Ion3 is obtained in the case that the gate voltage is 3.3 V and the drain voltage is 10 V.

As will be later described, as the MOS transistor is used as an amplifier for amplifying a high frequency signal, the operating point changes along a dynamic load line. The dynamic load line includes an operating point having a very large potential difference between the gate and drain like the operating point Ion4.

Figure 6:
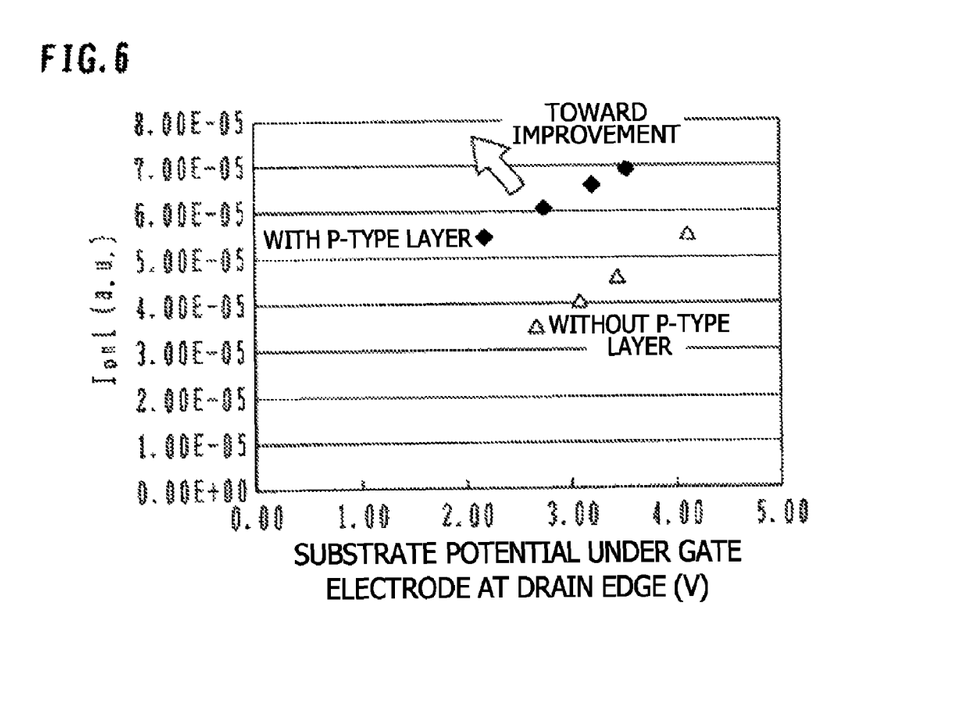
FIG. 6 is a graph illustrating simulation results of a relation between a breakdown voltage performance and an on-resistance of the MOS transistor of the first embodiment.

FIG. 6 is a graph illustrating the simulation results of a relation between a breakdown voltage and an on-resistance of the MOS transistor of the first embodiment. The graph illustrates also the relation between a breakdown voltage and an on-resistance of a comparative example of a MOS transistor having the structure that the opposite conductivity type region 8 is removed from the MOS transistor of the first embodiment.

The abscissa of the graph represents a substrate voltage in the unit of V under the gate electrode at the drain edge. The lower the substrate voltage is, it is judged that a breakdown voltage is higher, because a potential difference between the gate electrode at the drain edge and the underlying substrate is small. The ordinate of the graph represents an on-current at the operating point Ion1 in an arbitrary unit. The larger the on-current is, the on-resistance is suppressed lower.

Triangle plots (without the p-type layer) indicate the results of the comparative example, and rhombus plots (with the p-type layer) indicate the results of the first embodiment. As compared to the comparative example, the plots of the first embodiment moves upper left. Namely, the embodiment lowers more a substrate voltage under the gate electrode at the drain edge to raise the breakdown voltage, and increases the on-current to suppress an on-resistance.

Figure 7A:
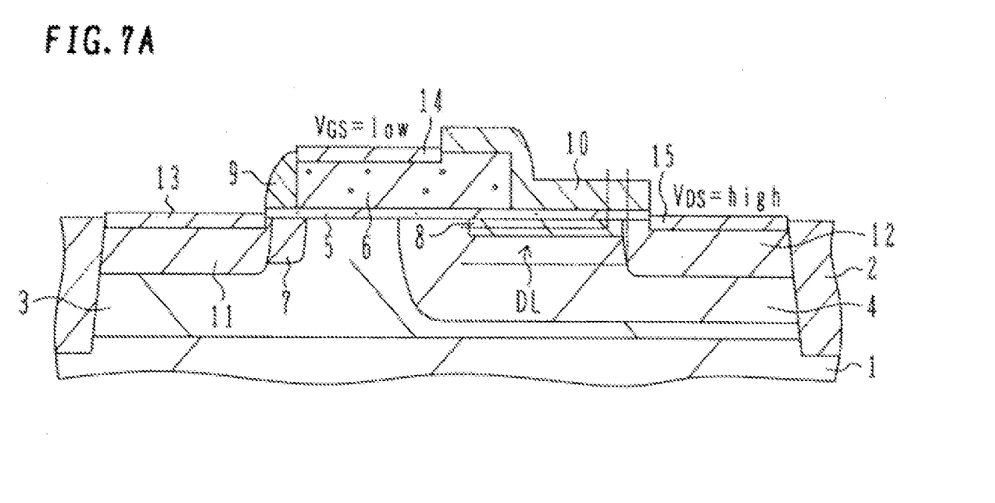
FIG. 7A is a schematic cross sectional view of the MOS transistor of the first embodiment in a state that a gate voltage $V_{GS}$ is near 0 V and a drain voltage $V_{DS}$ is very high.
Figure 7B:
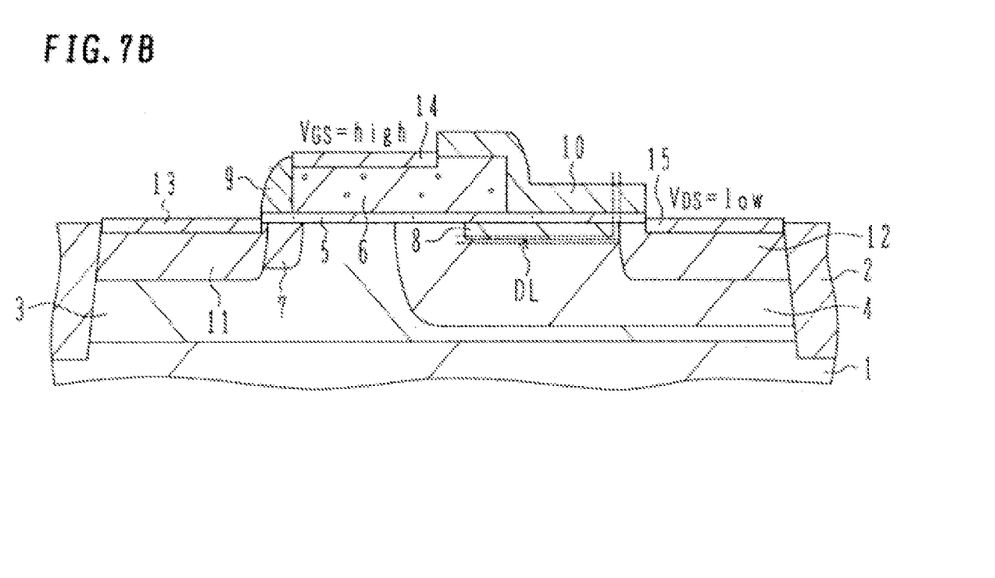
FIG. 7B is a schematic cross sectional view of the MOS transistor of the first embodiment in a state that the gate voltage $V_{GS}$ is high to some extent and the drain voltage $V_{DS}$ is low.

Next, with reference to FIGS. 7A and 7B, studies will be made on the principle that the first embodiment MOS transistor raises the breakdown voltage, and on the principle that even if the breakdown voltage is raised, an increase in the on-resistance is suppressed.

First, with reference to FIG. 7A, studies will be made on the breakdown voltage raising mechanism in the state that the gate voltage $V_{GS}$ is near 0 V (e.g., 0.3 V) and the drain voltage $V_{DS}$ is very high (e.g., 10 V). As the opposite conductivity type region 8 forms the pn junctions with the LDD region 4 and HDD region 12, a depletion layer DL is formed. The higher the drain voltage $V_{DS}$ becomes, the wider the depletion layer DL becomes. The higher the drain voltage $V_{DS}$ becomes, the potential drop by the depletion layer DL becomes therefore larger. Namely, it is considered that even if the drain voltage $V_{DS}$ becomes high, a voltage increase applied to the substrate under the gate electrode at the drain edge is suppressed and the breakdown voltage is improved.

Since an impurity concentration of the opposite conductivity type region 8 is higher than an impurity concentration of the LDD region 4, the depletion layer DL extends more toward the LDD region 4 than toward the opposite conductivity type region 8 at the pn junction between the opposite conductivity type region 8 and LDD region 4. Since an impurity concentration of the HDD region 12 is higher than an impurity concentration of the opposite conductivity type region 8, the depletion layer DL extends more toward the opposite conductivity type region 8 than toward the HDD region 12 at the pn junction between the opposite conductivity type region 8 and HDD region 12.

Next, with reference to FIG. 7B, studies will be made on the on-resistance suppressing mechanism in the state that the gate voltage $V_{GS}$ high to some extent (e.g., 3.3 V) and the drain voltage $V_{DS}$ is low (e.g., 0.1 V). When the drain voltage $V_{DS}$ is low, extension of the depletion layer DL is small. Carriers are therefore able to be transferred via a wider cross section of the LDD region 4. If the drain voltage $V_{DS}$ is low, a potential drop becomes therefore small and an increase in the on-resistance is suppressed.

Studies will further be made on the advantages of the structure described with reference to FIG. 4. The left end X2 of the opposite conductivity type region 8 is disposed spaced apart from the left end X1 of the LDD region 4 toward the HDD region 12 side (X1<X2). Namely, the n-type LDD region 4 is retained more toward the source side than the p-type opposite conductivity type region 8. The on-resistance at the low drain voltage is therefore able to be suppressed low, as compared to the state that the left end X2 of the opposite conductivity type region 8 is disposed reaching the left end X1 of the LDD region 4.

In the MOS transistor of the first embodiment, the left end X2 of the opposite conductivity type region 8 is positioned more toward the source side than the right end XGD of the gate electrode 6 (X2<XGD). Namely, the opposite conductivity type region 8 is formed creeping under the drain side end of the gate electrode 6. As viewed along the vertical direction, the opposite conductivity type region 8 exists between the drain side end of the gate electrode 6 and the LDD region. A high breakdown voltage is therefore able to be retained at the drain side end of the gate.

The right end XGD of the gate electrode 6 is spaced apart from the left end X3 (right end of the opposite conductivity type region 8) of the HDD region 12 (XGD<X3). Namely, the drain side end of the gate electrode 6 is spaced apart from the HDD region 12. As the depletion layer is extended toward the LDD region 4 by making the high concentration n-type HDD region 12 be spaced apart from the drain side end of the gate electrode 6, a breakdown voltage is likely to be improved.

The right end X3 of the opposite conductivity type region 8 is spaced apart from the left end X4 of the drain side silicide region 15 (X3<X4). Namely, the opposite conductivity type region 8 is not in contact with the drain side silicide region 15. It is therefore possible not to hinder the extension of the depletion layer at the pn junction between the opposite conductivity type region 8 and HDD region 12 when a high drain voltage is applied. The opposite conductivity type region 8 is not silicidated because this region is covered with the silicide block insulating film 10. The extension of the depletion layer in the opposite conductivity type region 8 is not hindered.

As described above, in the MOS transistor of the first embodiment, the opposite conductivity type region is formed on the surface region between the HDD region and gate electrode in the LDD region. The pn junctions formed by the opposite conductivity type region with the adjacent regions form the depletion layer.

As a high drain voltage is applied, the depletion layer extends so that a potential drop becomes large to suppress application of a high voltage to the substrate under the gate electrode at the drain side end. As a low drain voltage is applied, the extension of the depletion layer becomes small so that a potential drop is suppressed to suppress an on-resistance increase. While an increase in the on-resistance is suppressed, it becomes therefore possible to improve a breakdown voltage.

Figure 8:
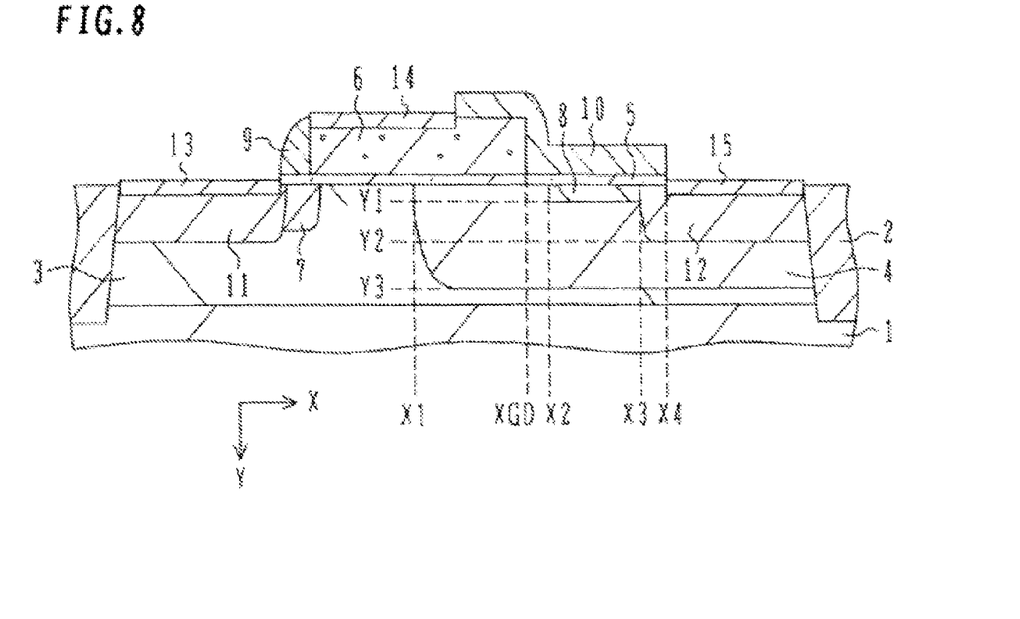
FIG. 8 is a schematic cross sectional view of a MOS transistor of a modification of the first embodiment.

Next, with reference to FIG. 8, description will be made on a MOS transistor according to a modification of the first embodiment. A different point of the modification from the first embodiment resides in that the source side end (left end) X2 of the opposite conductivity type region 8 is disposed more toward the HDD region 12 side than the drain side end XGD of the gate electrode 6 (XGD<X2).

Namely, in this modification, the opposite conductivity type region 8 is formed spaced apart from the drain side end of the gate electrode 6, and does not creep under the drain side end of the gate electrode 6. The LDD region 4 is disposed just under the drain side end of the gate electrode 6. It is therefore considered that although a breakdown voltage at the drain side end of the gate is slightly lowered, parasitic capacitance is able to be reduced allowing a high speed operation because the opposite conductivity type region 8 is not disposed just under the drain side end of the gate electrode 6.

Description will be made on a manufacture method for the MOS transistor of the modification. Although the MOS transistor of the modification is manufactured by similar processes to the manufacture method for the MOS transistor of the first embodiment described with reference to FIGS. 1A to 3C, the process of forming the opposite conductivity type region 8 described with reference to FIG. 2C is different.

In the first embodiment, p-type impurity ions are implanted in an oblique direction to form the opposite conductivity type region 8 creeping under the gate electrode 6. In the modification, p-type impurity ions are implanted in the opposite oblique direction relative to the first embodiment to form the opposite conductivity type region 8 spaced apart from the gate electrode 6.

Figure 9:
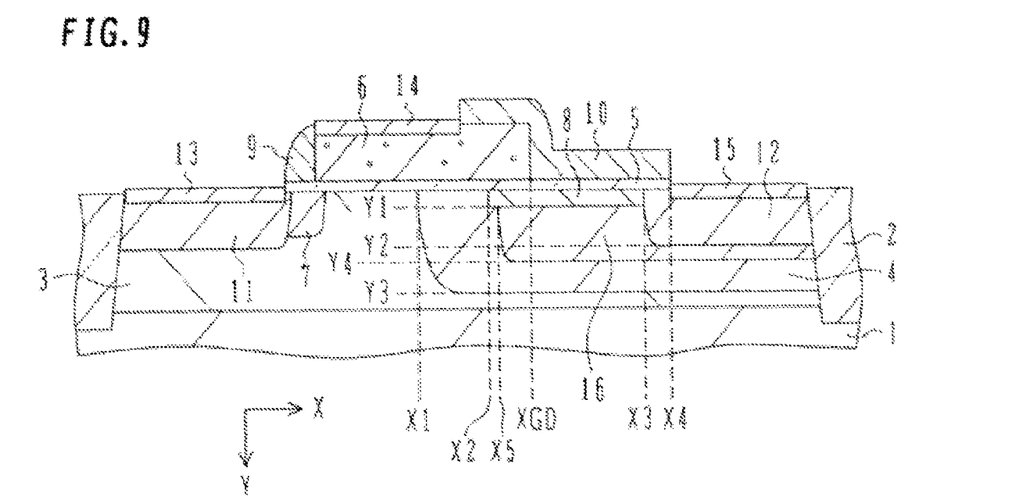
FIG. 9 is a schematic cross sectional view of a MOS transistor of a second embodiment.
Figure 10A:
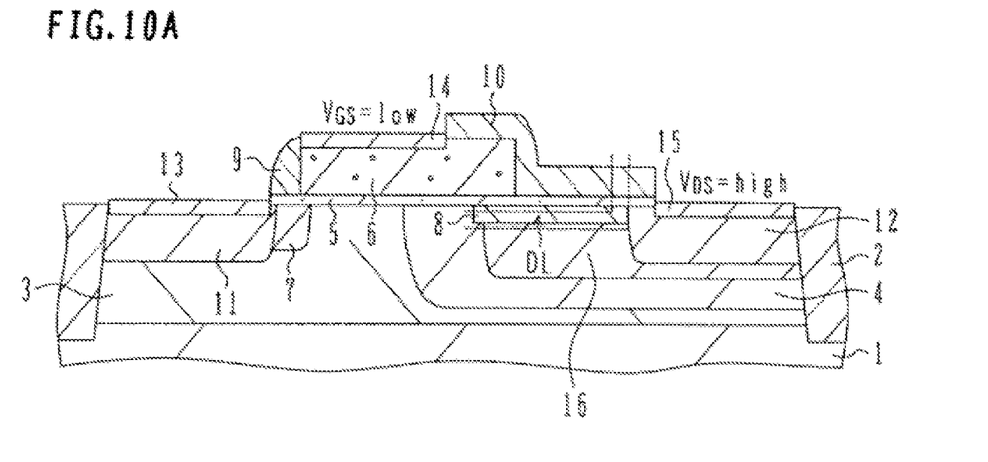
FIG. 10A is a schematic cross sectional view of the MOS transistor of the second embodiment in a state that a gate voltage $V_{GS}$ is near 0 V and a drain voltage $V_{DS}$ is very high.
Figure 10B:
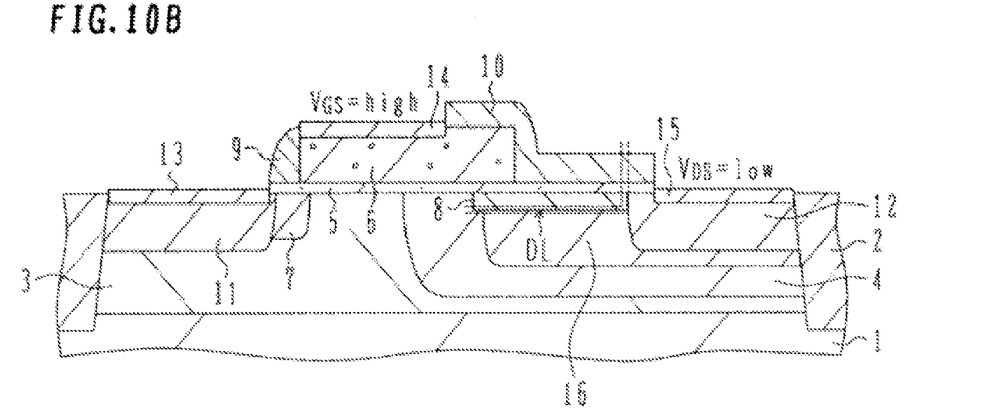
FIG. 10B is a schematic cross sectional view of the MOS transistor of the second embodiment in a state that the gate voltage $V_{GS}$ is high to some extent and the drain voltage $V_{DS}$ is low.

Next, with reference to FIGS. 9 to 11, description will be made on a MOS transistor of the second embodiment.

First, with reference to FIG. 9, description will be made on the structure of the MOS transistor of the second embodiment. A different point from the MOS transistor of the first embodiment resides in that in the LDD region 4 (this region is called a first LDD region 4), an LDD region 16 (this region is called a second LDD region 16) is formed having a higher n-type impurity concentration than the first LDD region.

The left end of the second LDD region 16 along the horizontal direction is represented by X5. First, description will be made on the positional relation between the second LDD region 16 and other regions in the horizontal direction.

The second LDD region 16 is formed in the first LDD region 4, and the left end X5 of the second LDD region 16 is nearer to the drain side than the left end X1 of the first LDD region 4 (X1<X5).

The HDD region 12 is formed in the second LDD region 16, and the left end X3 of the HDD region 12 is nearer to the drain side than the left end X5 of the second LDD region 16 (X5<X3).

The surface layer of the second LDD region 16 nearer to the source side than the HDD region 12 is the opposite conductivity type region 8. In the example illustrated in FIG. 9, the opposite conductivity type region 8 juts out from the second LDD region 16 to the first LDD region 4, and the left end X2 of the opposite conductivity type region 8 is nearer to the source side than the left end X5 of the second LDD region 16 (X2<X5).

The opposite conductivity type region 8 may be formed in the second LDD region 16, and the left end X2 of the opposite conductivity type region 8 may be disposed nearer to the HDD region 12 than the left end X5 of the second LDD region (X5<X2). Alternately, the left end X2 of the opposite conductivity type region 8 may be set flush with the left end X5 of the second LDD region 16 (X5=X2). There is a trade-off between a breakdown voltage and an on-resistance (on-resistance is expressed by an inverse of the operating point Ion1 in FIG. 5). A relatively good breakdown voltage is obtained by X2<X5, and a relatively good on-resistance is obtained by X5<X2. However, it makes no difference which of the positional relations is selected, because the opposite conductivity type region is formed in self alignment with the gate.

The gate electrode 6 is formed overlapping the second LDD region 16, and the left end X5 of the second LDD region 16 is nearer to the source side than the right end XGD of the gate electrode (X5<XGD). In order to improve a breakdown voltage, it is therefore preferable to make the second LDD region 16 creep under the gate. Since the breakdown voltage is ensured already, it is considered that a breakdown voltage performance does not change even in XGD<X5.

The bottom end of the second LDD region 16 along the vertical direction is represented by Y4. Next, description will be made on the positional relation between the second LDD region 16 and other regions in the vertical direction.

The second LDD region 16 is formed in the first LDD region 4, and the bottom end Y4 of the second LDD region 16 is disposed above the bottom end Y3 of the first LDD region 4 (Y4<Y3).

The HDD region 12 is formed in the second LDD region 16, and the opposite conductivity type region 8 is formed on the surface of the second LDD region 16. The bottom end Y1 of the opposite conductivity type region 8 and the bottom end Y2 of HDD region 12 are disposed above the bottom end Y4 of the second LDD region 16 (Y1<Y2<Y4). The second LDD region 16 and opposite conductivity type region 8 form an np junction at the bottom end of the opposite conductivity type region 8.

Next, description will be made on the relation among an impurity concentration NL1 of the first LDD region 4, an impurity concentration NL2 of the second LDD region 16, an impurity concentration NP of the opposite conductivity type region 8, and an impurity concentration NH of the HDD region 12. These impurity concentrations satisfy NL1<NP<NL2<NH.

Next, description will be made on the advantages of the MOS transistor of the second embodiment. In the second embodiment, an impurity concentration of the second LDD region 16 is set higher than that of the opposite conductivity type region 8.

First, with reference to FIG. 10A, description will be made on the state that the gate voltage $V_{GS}$ is near 0 V (e.g., 0.3 V) and the drain voltage $V_{DS}$ is very high (e.g., 10 V). Similar to the first embodiment, the p-type opposite conductivity region 8 forms pn junctions with adjacent n-type regions so that as the drain voltage $V_{DS}$ becomes high, the depletion layer DL extends to improve the breakdown voltage.

In the second embodiment, since the impurity concentration of the second LDD region 16 is higher than that of the opposite conductivity type region 8, the depletion layer DL extends more toward the opposite conductivity type region 8 than the second LDD region, at the pn junction between the opposite conductivity type region 8 and second LDD region 16.

Since the depletion layer DL extends toward the opposite conduction type region 8, a current path is able to be moved near to the surface. It is therefore possible to suppress an increase in a parasitic resistance, make the first LDD region 4 shallow, and suppress a variation in channel lengths.

Also in the second embodiment, since the opposite conductivity type region 8 creeps under the gate electrode 6 at the drain side end, a large breakdown voltage is likely to be ensured, similar to the first embodiment.

Next, with reference to FIG. 10B, description will be made on the state that the gate voltage $V_{GS}$ high to some extent (e.g., 3.3 V) and the drain voltage $V_{DS}$ is low (e.g., 0.1 V). Similar to the first embodiment, while the drain voltage $V_{DS}$ is low, extension of the depletion layer is small and a potential drop is small so that an increase in the on-resistance is suppressed.

In the second embodiment, the second LDD region 16 having an impurity concentration higher than that of the first LDD region 4 is formed in the first LDD region 4. It is expected that a parasitic resistance is reduced and the on-resistance is improved more than the first embodiment.

Next, description will be made on a manufacture method for the MOS transistor of the second embodiment. The processes up to a process of forming the low concentration source region 7 described with reference to FIG. 2 are similar to the first embodiment. Processes to follow will be described.

Figure 11:
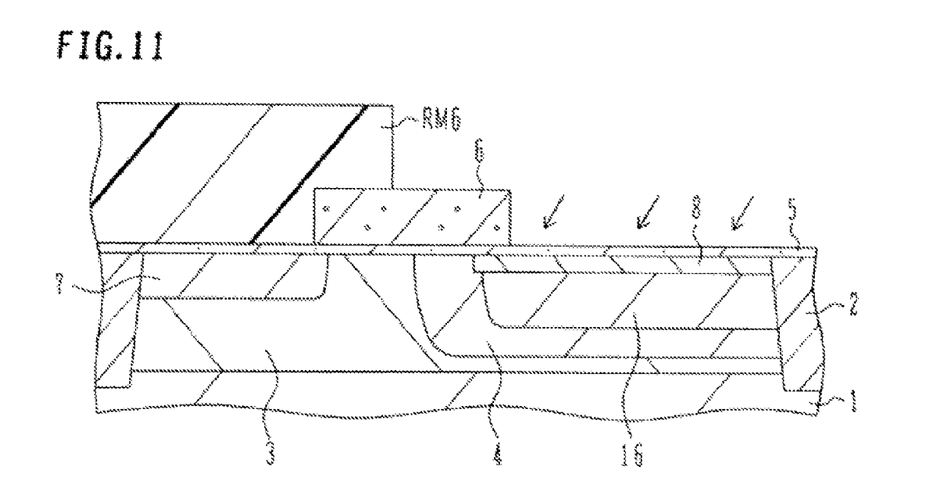
FIG. 11 is a schematic cross sectional view illustrating processes of manufacturing the MOS transistor of the second embodiment.

As illustrate in FIG. 11, by covering the low concentration source region 7 with a resist mask RM6 and using the gate electrode 6 as a mask, for example, B ions are implanted into the first LDD region 4 at an acceleration energy of 3 keV and a dose of 1E13 to change the conductivity type of a surface layer of the first LDD region 4 from an n-type to a p-type and form the opposite conductivity type region 8, similar to the first embodiment.

In succession, for example, As is implanted at a range deeper than the opposite conductivity type region 8 at an acceleration energy of 80 keV and a dose of 1E14, to form the second LDD region 16 just under the opposite conductivity type region 8. A concentration of impurity for determining the conductivity type of the second LDD region 16 is set higher than that of the opposite conductivity type region 8. After the opposite conductivity type region 8 and second LDD region 16 are formed, the resist mask RM6 is removed.

Thereafter, similar to the processes of the first embodiment described with reference to FIGS. 3A to 3C, the side wall spacer 9 and silicide block insulating film 10 are formed, the high concentration source region 11 and HDD region 12 are formed, and the source side silicide region 13, gate silicide region 14 and drain side silicide region 15 are formed. When the HDD region 12 is formed, n-type impurities are implanted into the opposite conductivity type region 8 and underlying second LDD region 16. The MOS transistor of the second embodiment is formed in the manner described above.

Next, with reference to FIG. 12, description will be made on a MOS transistor of a modification of the second embodiment. Similar to the modification of the first embodiment, the modification of the second embodiment is different from the second embodiment in that the opposite conductivity type region 8 is formed spaced apart from the drain side end of the gate electrode 6 toward the HDD region 12, and does not creep under the drain side end of the gate electrode. Similar to the modification of the first embodiment, also in the modification of the second embodiment, the opposite conductivity type region 8 is not disposed just under the gate electrode 6 at the drain side end. It is therefore possible to reduce a parasitic capacitance and execute a high speed operation.

Figure 12:
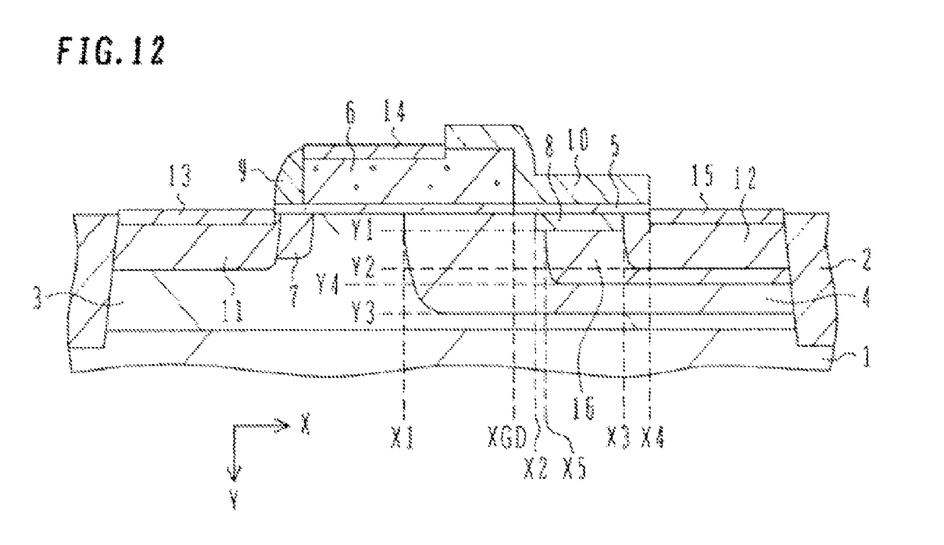
FIG. 12 is a schematic cross sectional view of a MOS transistor of a modification of the second embodiment.

In the example illustrated in FIG. 12, although the opposite conductivity type region 8 juts out from the second LDD region 16 to the first LDD region 4, the opposite conductivity type region 8 may be formed in the second LDD region 16, or both the ends of the opposite conductivity type region 8 and second LDD region 16 on the source side may be made flush with each other.

Description will be made on the manufacture method for the MOS transistor of the modification of the second embodiment. The MOS transistor of the modification is manufactured by processes similar to the manufacture method for the MOS transistor of the second embodiment, excepting that similar to the modification of the first embodiment, p-type impurity ions are implanted in such a manner that the opposite conductivity type region 8 is formed spaced apart from the gate electrode 6.

As described above in the first and second embodiments and corresponding modifications, since the opposite conductivity type region is formed between the gate electrode and high concentration drain region, the opposite conductivity type region forms pn junctions with adjacent regions. The depletion layer of the pn junction extends at a high drain voltage so that the breakdown voltage is improved.

Next, with reference to FIGS. 13A to 13C and FIG. 14, description will be made on a portable electronic apparatus applying the MOS transistor of the first or second embodiment.

Figure 13A:
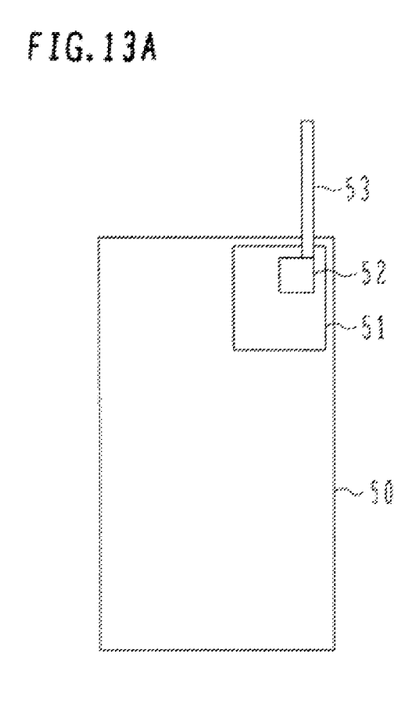
FIG. 13A is a schematic diagram illustrating a portable electronic apparatus of an application example.

FIG. 13A is a schematic diagram illustrating a portable electronic apparatus 50 of this application example. The portable electronic apparatus 50 is, for example, a mobile phone, and has a transmission module 51 including a power amplifier transistor 52. An output of the power amplifier transistor 52 is input to an antenna 53.

Figure 13B:
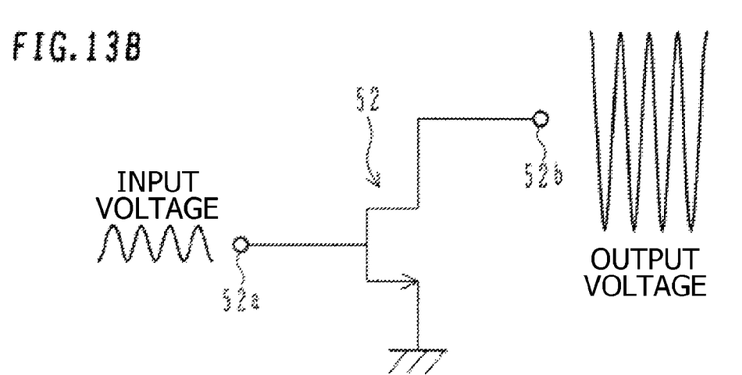
FIG. 13B is a circuit diagram of a power amplifier transistor.

FIG. 13B is a circuit diagram of the power amplifier transistor 52. The MOS transistor of the first or second embodiment is used as the power amplifier transistor 52. A high frequency input power is applied to a gate terminal 52a of the power amplifier transistor 52, and an output power obtained by amplifying the input power is output from a drain terminal 52b. The frequency of the input/output power is estimated to be in a range from 100 MHz order to GHz order (several hundred MHz to several GHz).

Figure 13C:
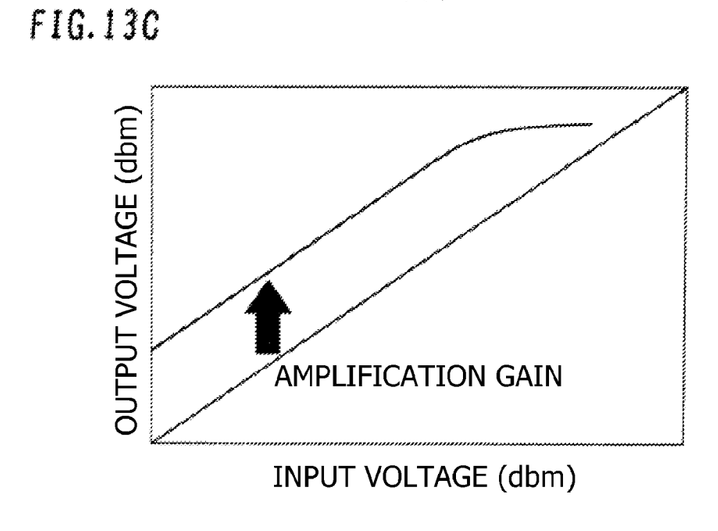
FIG. 13C is a graph illustrating an amplification gain of a power amplifier transistor.

FIG. 13C is a graph briefly illustrating an amplification gain of the power amplifier transistor 52. The abscissa and ordinate of the graph represent an input power and an output power in the unit of dBm, respectively. An output power is an input power amplified by the amplification gain.

For example, an AC input voltage of 0 V and 3.3 V is alternately applied to the gate terminal of the power amplifier transistor, and an amplified output is supplied from the drain terminal. The source terminal is grounded (0 V). For example, high frequency of GHz order is input/output. The drain voltage takes ultimately a very high value, and there occurs the state that a potential difference between the gate and drain exceeds far over 3.3 V. A locus of the operating point change of the power amplifier transistor is a dynamic load line.

Figure 14:
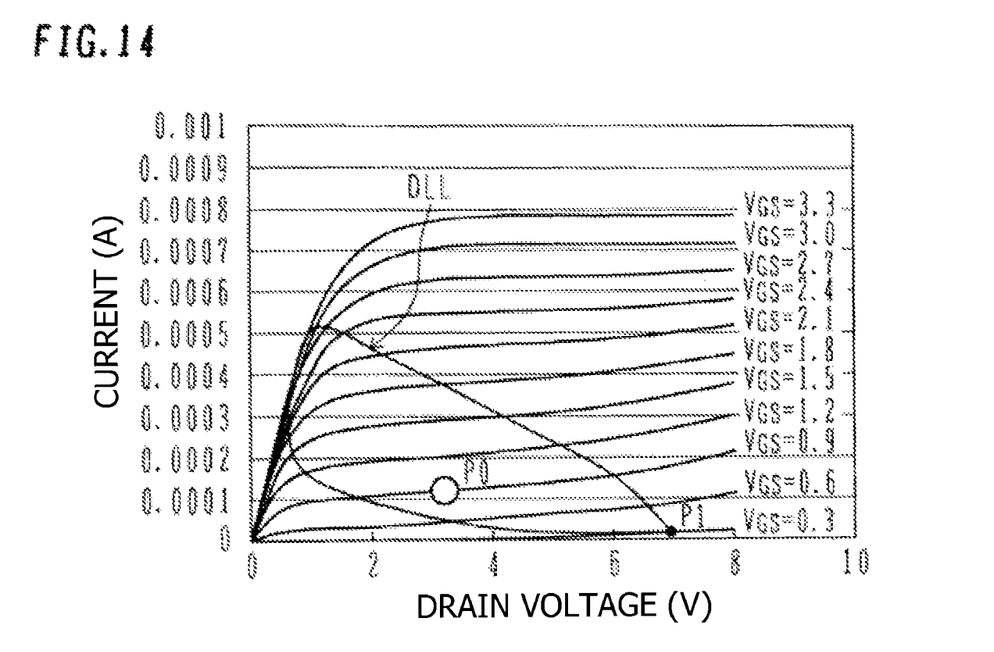
FIG. 14 is a graph illustrating a dynamic load line of a power amplifier transistor of an applied example.

FIG. 14 is a graph illustrating a dynamic load line of the power amplifier transistor of this application example. The abscissa of the graph represents a drain voltage in the unit of V, and the ordinate represents a current in the unit of A. The graph illustrates IV curves at gate voltages $V_{GS}$ of 0.3 V, 0.6 V, 0.9 V, 1.2 V, 1.5 V, 1.8 V, 2.1 V, 2.4 V, 2.7 V, 3.0 V and 3.3 V, and a dynamic load line DLL.

A highest drain voltage on the dynamic load line DLL is about 7 V, and an operating point P1 is an operating point having a gate voltage of about 0.3 V near to 0 V. A bias point P0 is an operating point of the power amplifier transistor whose operation is observed from DC operation viewpoint.

At an operation voltage of 3.3 V, the drain voltage at the operating point P1 is about 7 V which is higher than twice of the operation voltage. A breakdown voltage performance is desired which is able to resist a potential difference between the gate and drain, at least higher than twice of the operation voltage.

The MOS transistor of the first and second embodiment has an improved breakdown voltage because of the opposite conductivity type region 8, and is suitable for being used as the power amplifier transistor described above. The gate insulating film of the MOS transistor of the first and second embodiment is illustratively given having a breakdown voltage estimating an operation voltage of 3.3 V in DC operation.

The MOS transistor of this application has the structure of the first or second embodiment. With this structure, the gate insulating film itself estimating a breakdown voltage of 3.3 V, for example, in DC operation is able to provide a breakdown voltage performance capable of resisting a high potential difference between the gate and drain to be caused by a power amplifier application or the like, for example, high frequency application such as GHz band.

The n-type MOS transistor described in the embodiments is preferable, for example, for power amplifier transistor application. However, a breakdown voltage is improved also for a p-type MOS transistor obtained by reversing the n-type and p-type in the embodiment description, by forming an n-type opposite conductivity type region.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A semiconductor device comprising:
   a semiconductor substrate having a first region of a first conductivity type;
   a gate insulating film formed on said semiconductor substrate and above said first region;
   a gate electrode formed on said gate insulating film;
   a source region of a second conductivity type opposite to said first conductivity type formed in said semiconductor substrate, above said first region and below one side of said gate electrode;
   a first low concentration drain region of said second conductivity type formed in said semiconductor substrate, located above said first region and below another side of said gate electrode, and including a first end which is opposite to a side of said source region and which is located under said gate electrode;
   a high concentration drain region of said second conductivity type formed in said semiconductor substrate, located above said first region, on said first low concentration drain region and apart from said gate electrode, an impurity concentration of said high concentration drain region being higher than an impurity concentration of said first low concentration drain region; and an opposite conductivity type region of said first conductivity type formed in said semiconductor substrate, located on a part of said first low concentration drain region and between said high concentration drain region and said first low concentration region, a part of said opposite conductivity type region being located at a surface of said semiconductor surface, said opposite conductivity type region and said first low concentration drain region forming a pn junction, said opposite conductivity type region and said high concentration drain region forming a pn junction, an impurity concentration of said opposite conductivity type region being higher than said impurity concentration of said first low concentration drain region, and lower than said impurity concentration of said high concentration drain region and said opposite conductivity type region including a second end which is opposite to said source region and which is located under said gate electrode.

2. The semiconductor device according to claim 1, wherein said second end is positioned nearer to a side of said high concentration drain region than said first end.

3. The semiconductor device according to claim 1, further comprising a silicide region formed on a surface of said high concentration drain region which is located apart from said opposite conductivity type region.

4. The semiconductor device according to claim 3, further comprising
an insulating film formed exposing said silicide region and covering said opposite conductivity type region.

5. The semiconductor device according to claim 1, wherein said first conductivity type is a p-type and said second conductivity type is an n-type.

6. The semiconductor device according to claim 1, wherein the semiconductor device is a portable electronic apparatus, a high frequency input power is applied to said gate electrode, and said high concentration drain region outputs a high frequency output power obtained by amplifying said input power applied to said gate electrode.

7. The semiconductor device according to claim 1, further comprising a second low concentration drain region of said second conductivity type located between said first low concentration drain region and said high concentration drain region.

8. The semiconductor device according to claim 7, wherein an impurity concentration of said second low concentration drain region is higher than said impurity concentration of said opposite conductivity type region and lower than said impurity concentration of said high concentration drain region.

9. The semiconductor device according to claim 7, wherein said opposite conductivity type region and said second low concentration drain region form a pn junction.

* * * * *